US006239597B1

(12) United States Patent
McKinnon

(10) Patent No.: US 6,239,597 B1
(45) Date of Patent: May 29, 2001

(54) METHOD AND APPARATUS FOR RAPID T2 WEIGHTED MR IMAGE ACQUISITION

(75) Inventor: Graeme C. McKinnon, Hartland, WI (US)

(73) Assignee: General Electric Company, Milwaukee, WI (US)

( * ) Notice: Subject to any disclaimer, the term of this patent is extended or adjusted under 35 U.S.C. 154(b) by 0 days.

(21) Appl. No.: 09/417,715

(22) Filed: Oct. 14, 1999

(51) Int. Cl.$^7$ .................................................. G01V 3/00
(52) U.S. Cl. ........................ 324/307; 324/309; 324/312
(58) Field of Search .................... 324/307, 309, 324/310, 312, 314, 300

(56) References Cited

U.S. PATENT DOCUMENTS 5,561,369 * 10/1996 Feinberg et al. .................... 324/307

OTHER PUBLICATIONS

TW Redpath, RA Jones, "FADE—A new fast imaging sequence", *Magn. Reson. Med*, 6, pp., 224–234 (1988).
SY Lee, ZH Cho, "Full utilization of the echo and FID signal in SSFP fast NMR imaging", *SMRM conference abstracts*, p. 460 (1987).
T.W. Redpath, RA Jones, J.R. Mallard, "FADE—A new fast imaging sequence" *Magn. Reson.Med*, 6, NY p. 228 (1987).
M Deimling, O Heid, U Bottcher, "SSFP imaging with synergistic T1–T2 contrast", *SMRM conference abstracts*, p. 1206 (1993).
K Gjesdal, G Thorkildsen, "3D FADE imaging", *SMRM conference abstracts*, p. 1207 (1993).
J. Hennig, "Multiecho imaging sequences with low refocusing flip angles", *J. Magn. Reson.*, 78, pp. 397–407 (1988).
Y. Zur, S. Stokar, P. Bendel, "An analysis of fast imaging sequences wth steady–state transverse magnetization refocusing", *MRM*, 6, pp. 175–193 (1988).
R.R. Ernst, W.A. Anderson, "Application of Fourier transformation spectroscopy to magnetic resonance", *Rev. Sci. Instru*, pp. 93–102 (1966).
R. Freeman, H.D.W. Hill, "Phase and intensity anomalies in Fourier transform MNR", *J. Magn. Reson.*, 4, pp. 366–383.
W.S. Hinshaw, "Image formation by nuclear magnetic resonance: The sensitive point method", *J. Appl. Phys.*, 47, pp. 3709–3721 (1976).
P.van der Meulen, J.P. Groen, A.M.C. Tinus, G. Bruntink, "Fast field echo imaging: an overview and contrast calculations", *Magn. Resn. Imag.*, 6, pp. 355–368 (1988).
R.Graumann, H.Fischer, H. Barfuss, H. Bruder, A. Oppelt and M. Deimling "Contrast behavior of steady state sequences in inhomogeneous fields", *SMRM conference abstracts* NY p. 444 (1987).
Y. Zur, M.L. Wood, L.J. Neuringer, "Spoiling of transvers magnetization in steady–state sequences", *Magn. Reson. Med.*, 21, pp. 251–263 (1991).

* cited by examiner

Primary Examiner—Christine Oda
Assistant Examiner—Brij B. Shrivastav
(74) Attorney, Agent, or Firm—Cook & Franke S.C.; Christian G. Cabou; Phyllis Y. Price

(57) ABSTRACT

The present invention relates to magnetic resonance imaging (MRI) and includes a method and apparatus to rapidly acquire T2 weighted MR images in a repetition time comparable to times usually associated with T1 weighted imaging. The invention also includes a pulse sequence for use with MR image acquisition to accomplish the foregoing. Two embodiments are disclosed, both of which have in common the use of a pulse sequence that has a first and second RF pulse, each RF pulse separated by an interval τ and wherein the phase of the second and subsequent RF pulses is incremented linearly so as to spoil undesirable RF signal coherences so that the system can operate in steady state and acquire pure T2 weighted image in a time (TR) usually associated with T1 date acquisition.

31 Claims, 3 Drawing Sheets

METHOD AND APPARATUS FOR RAPID T2 WEIGHTED MR IMAGE ACQUISITION

BACKGROUND OF THE INVENTION

The present invention relates generally to magnetic resonance imaging (MRI), and more particularly to, a method and apparatus to rapidly acquire T2 weighted MR images with a steady state pulse sequence.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

One of the problems with acquiring T2 weighted images is that conventional techniques require a relatively long repetition time (TR) in order to achieve a pure T2 (proton density) image contrast. In other words, T2 weighted imaging is generally associated with long imaging times, as compared to T1 weighted imaging. T1 imaging is much faster since such imaging is achieved by shortening the repetition time.

Rapid imaging methods and sequences typically use short pulse repetition times and gradient reversal echoes. Often pulse repetition times are comparable with the transverse relaxation time T2, whereby the transverse magnetization is not destroyed between phase encoding cycles. The common factor between most of the prior art rapid imaging sequences is the application of a closely spaced train of excitation pulses with a flip angle, usually equal to or less than 90°. The signal is sampled between the pulses, following phase encoding dephasing/rephasing by a frequency encoding or view gradient. However, changes in the various gradient patterns will lead to significant differences in the resulting steady state signal, and image contrast. The different variants of the basic rapid acquisition concept may be categorized as either spoiling or refocusing sequences, depending on whether the transverse magnetization component contributes to the steady state magnetization. In spoiling, the transverse magnetization is destroyed between cycles, and only the longitudinal magnetization component contributes to this steady state.

To preserve the steady state, which includes the transverse magnetization, the effect of incrementing the phase encoding gradient must therefore be canceled. This can be done by applying a gradient of opposite area in each cycle, between data collection and the onset of the next pulse, which has led to the development of the refocusing sequences. In prior art spoiling sequences, the signal intensities are strongly T1 weighted, and it is not possible to obtain such pure T1 weighted contrast by using other rapid sequences. The refocusing sequences create contrast which are neither pure T1 nor pure T2 weighted, but are more of a ratio of T1 and T2 weighting. For similar reasons, it is difficult to obtain pure T2 weighted contrast by the refocusing technique.

Other prior art rapid imaging schemes using steady state coherent imaging methods can acquire two images simultaneously. However, one image is a mixed T1 and T2 contrast image, and the other is similar to the first with an additional T2 weighting. With appropriate sequence parameters, the ratio of the two images can approach a pure T2 weighted image, but they are not pure T2 weighted images, and therefore are less desirable. For good T2 weighting, the flip angle must be high, preferably near 90°. However, since there is a distribution of flip angles throughout a slice, the contrast is quite variable throughout the slice with such methods. With 3-D imaging, this is theoretically less of a problem in central slices where the flip angles can be closer to 90°. However, even with 3-D imaging, the resulting images have been less than desirable.

It would therefore be desirable to have a method and apparatus capable of rapid T2 weighting of MR images in times that approximate T1 imaging that can function in steady state and provide pure T2 weighted contrast images, and obtain pure T1 contrast.

SUMMARY OF THE INVENTION

The present invention relates to magnetic resonance imaging (MRI) and includes a method and apparatus to rapidly acquire T2 weighted MR images in a repetition time comparable to times usually associated with T1 weighted imaging that solves the aforementioned problems. The invention also includes a pulse sequence for use with MR image acquisition to accomplish the foregoing. Two embodiments are disclosed, both of which have in common the use of a pulse sequence that has first and second RF pulses. Each RF pulse is separated by an interval $\tau$ and the phase of the second and subsequent RF pulses are incremented linearly so as to spoil undesirable RF signal coherences so that the system can operate in steady state.

A method of acquiring T2 weighted MR images with reduced repetition time TR is disclosed which includes acquiring a first MR image having pure T1 weighted contrast, then acquiring a second MR image having both the pure T1 weighted contrast from the first MR image, together with pure T2 weighted contrast. The method next includes calculating a ratio image of the first and second MR images to acquire a T2 weighted contrast image, and then repeating the acquisition steps in steady state.

The pulse sequence disclosed for use with the method and apparatus includes first and second RF pulses, wherein each of the RF pulses is separated by an interval $\tau$ and have an amplitude and a phase, wherein the phase of the second and subsequent RF pulses in the pulse sequence are incremented linearly. The sequence includes at least two data acquisition periods in which data acquisition signals A and B are acquired. The data acquisition periods have centers offset from an RF pulse in the pulse sequence by an interval $\epsilon$. In order to operate in steady state, the slice gradient areas located between RF pulses are set to have equal areas and any phase encoding and rewinder gradients are equally paired.

In accordance with another aspect of the invention, an MRI apparatus is disclosed to rapidly acquire T2 weighted MR images. The MRI apparatus has a magnetic resonance imaging system having a plurality of gradient coils positioned about a bore of a magnet to impress a polarizing magnetic field. An RF transceiver system and an RF switch is controlled by a pulse module to transmit and receive RF signals to and from an RF coil assembly to acquire MR images. The MRI apparatus also has a computer programmed to transmit an RF pulse, then to adjust a phase of subsequent RF pulses to spoil undesirable RF signal coherences. The computer is also programmed to acquire a first MR image having pure T1 weighted contrast, and to acquire a second MR imaging having both pure T1 weighted contrast and pure T2 weighted contrast. The computer then calculates a ratio of the first and second MR images to acquire a pure T2 weighted contrast image in a repetition time (TR) that is usually associated with T1 imaging. A T1 image is readily reconstructed as a beneficial by-product.

In order to reconstruct the T2 weighted image, the method includes, and the computer is programmed to, create magnitude images for each of the first and second MR images and create a mask image from at least one of the magnitude images wherein any pixel value below a predetermined threshold is set to 0 and all others are set to 1, thereby eliminating low signal values. The ratio image calculated is accomplished by dividing each pixel value of the second MR image by a corresponding pixel value of the first MR image if the corresponding mask image pixel value has been set to 1, otherwise the ratio image pixel value is set to 0. The present invention is especially applicable in high resolution neurological imaging and breath-held abdominal imaging, and any other high resolution, isotropic voxel, 3-D, T2 weighted imaging.

Various other features, objects and advantages of the present invention will be made apparent from the following detailed description and the drawings.

BRIEF DESCRIPTION OF THE DRAWINGS

The drawings illustrate the best mode presently contemplated for carrying out the invention.

In the drawings.

DETAILED DESCRIPTION OF THE PREFERRED EMBODIMENT

Figure 1:
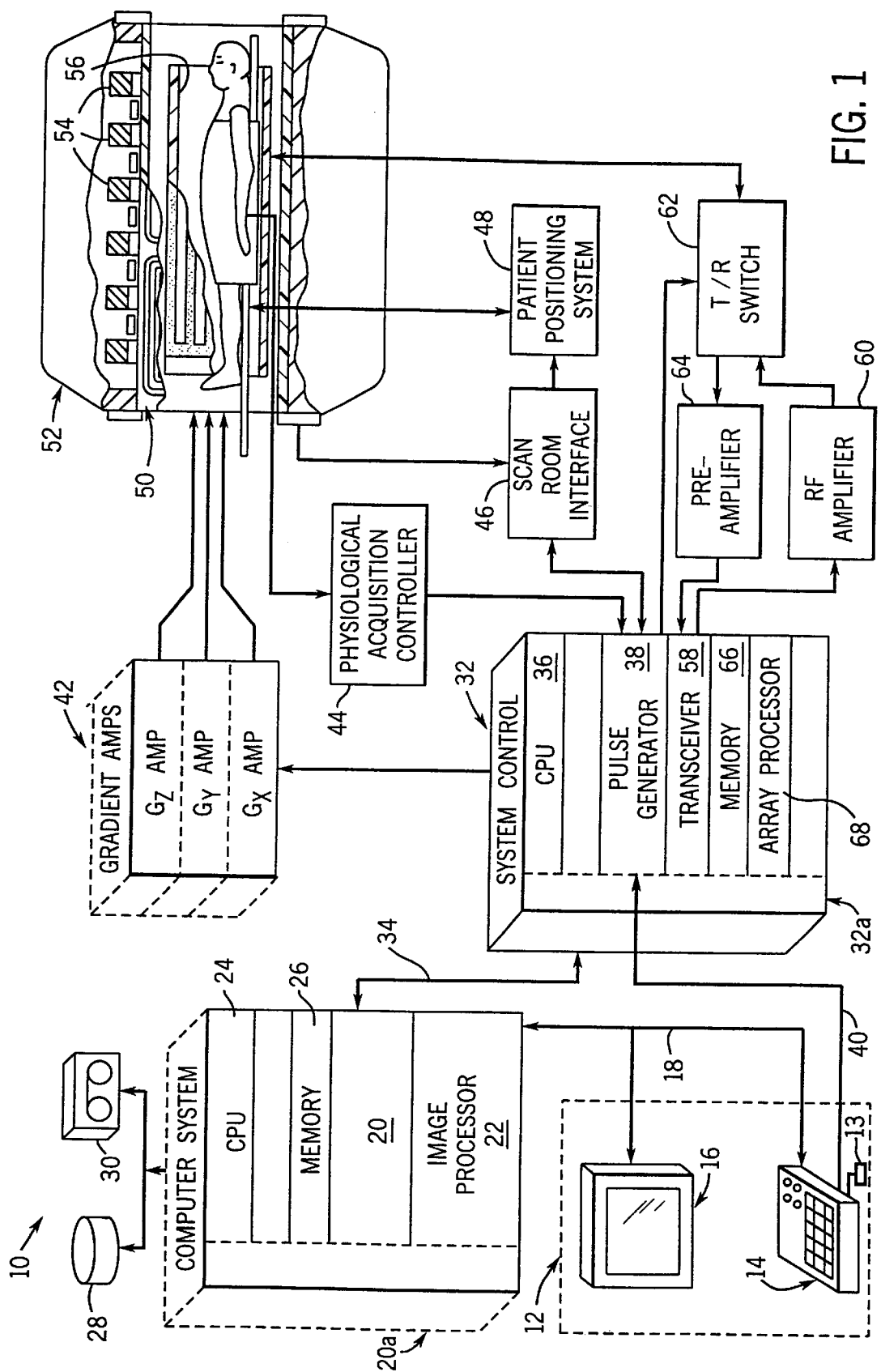
FIG. 1 is a schematic block diagram of an NMR imaging system for use with the present invention.

Referring to FIG. 1, the major components of a preferred MRI system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to a disk storage 28 and a tape drive 30 for storage of image data and programs, and it communicates with a separate system control 32 through a high speed serial link 34. The input device 13 can include a mouse, joystick, keyboard, track ball, touch screen, light wand, voice control, or similar such device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator which indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 also receives patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding gradient coil in an assembly generally designated 50 to produce the magnetic field gradients used for position encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals radiated by the excited nuclei in the patient may be sensed by the same RF coil 56 and coupled through the transmit/receive switch 62 to a preamplifier 64. The amplified NMR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 during the receive mode. The transmit/receive switch 62 also enables a separate RF coil (for example, a surface coil) to be used in either the transmit or receive mode.

The NMR signals picked up by the RF coil 56 are digitized by the transceiver module 58 and transferred to a memory module 66 in the system control 32. When a scan is completed, an array of raw k-space data has been acquired in the memory module 66. As will be described in more detail below, this raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in the disk memory 28. In response to commands received from the operator console 12, this image data may be archived on the tape drive 30, or it may be further processed by the image processor 22 and conveyed to the operator console 12 and presented on the display 16.

The present invention includes a method and system suitable for use with the above-referenced NMR system, or any similar or equivalent system for obtaining MR images.

Figure 2:
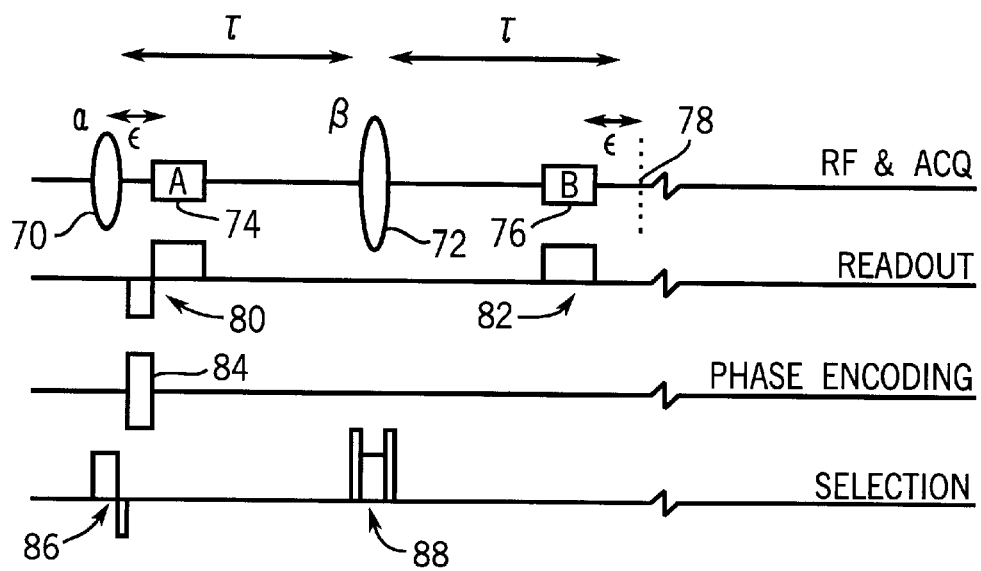
FIG. 2 is a timing diagram of a prior art pulse sequence.

Referring now to FIG. 2, a typical prior art dual-echo pulse sequence is shown in which a pair of RF pulses 70, 72, each of differing amplitudes, are each followed by a data acquisition period 74, 76, respectively. The RF pulses 70, 72 are equally spaced by a period τ. Each data acquisition period 74, 76, are offset by an interval ε, from a center point of the data acquisition period to the first RF pulse 70 and the natural spin echo location 78. Often times, the first RF pulse 70 has a phase of 90°, and the second RF pulse 72 has a phase of 180°. The readout gradient 80, includes a prephase gradient for the data acquisition period 74 and a readout gradient 82 for the data acquisition period 74. A phase encoding gradient 84 is transmitted after the first RF pulse 70, but before the data acquisition period 74. The selection gradients include the slice select and rephase gradient 86 and a refocusing gradient pulse 88. As is known, if this sequence is played out with a large repetition time TR, for example one that is much greater than T2 for tissue, then the data acquisition signal amplitudes acquired from the data acquisition periods 74 and 76 are given by:

$$S_A \sin(\alpha) \exp(-\epsilon/T2^*); S_b \sin(\alpha) \cos(\beta/2) \exp(-\epsilon/T2^*) \exp(-2\tau/T2). \quad [1]$$

where α & β denote the respective flip angles. The amplitude depends on the flip angle of the refocusing pulse, but otherwise the flip angle does not contribute to the inherent tissue contrast. T2* is often referred to as "T2 star" relaxation and is similar to T2 relaxation, with the exception that it includes an additional signal loss mechanism due to the phase dispersion within a voxel. This dispersion arises when there is a frequency spread within a particular voxel. As is known, where T2 is important for spin echo sequences, T2* is critical for gradient echo sequences where the static field inhomogeneities are not refocused.

The ratio of $S_B$ to $S_A$ is a T2 weighted signal.

In order to acquire images more rapidly, it is necessary to reduce the repetition time TR closer to that for acquiring pure T1 images. In order to do so in a controllable steady state manner, however, requires immediate repetition of the pulse sequence and the elimination of any time period for spin settlement after the natural spin echo location 78.

Figure 3:
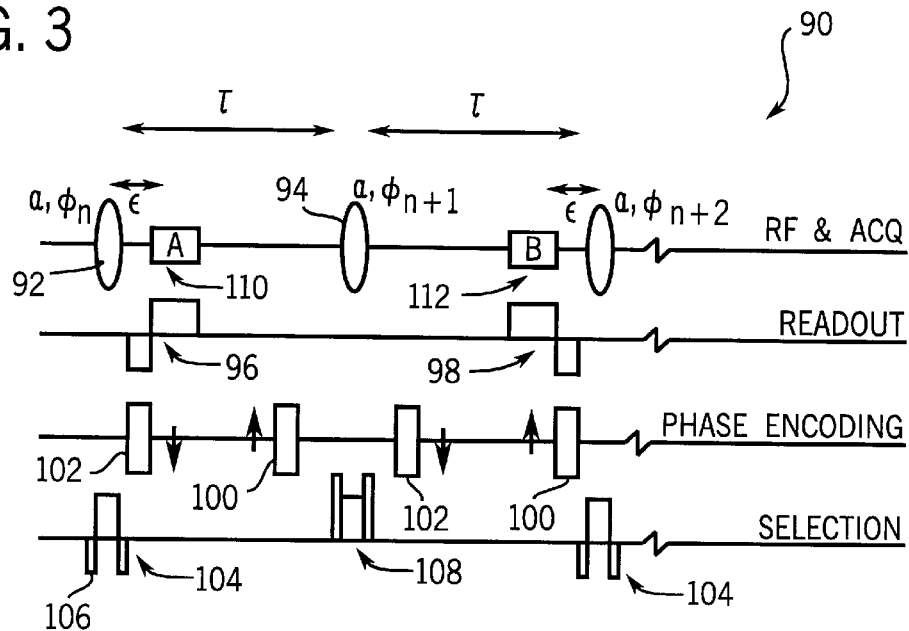
FIG. 3 is a timing diagram of a pulse sequence according to the present invention.
Figure 4:
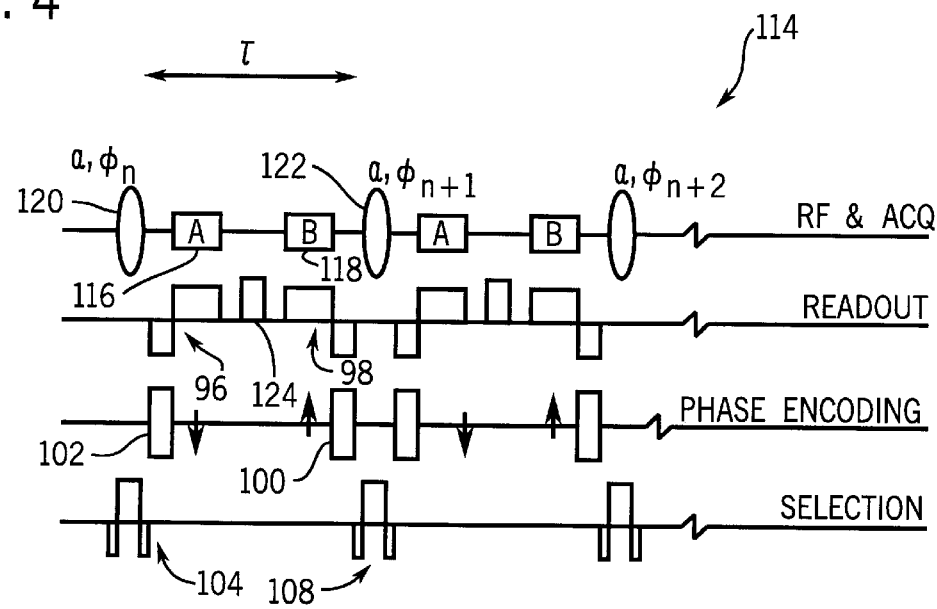
FIG. 4 is a timing diagram of another embodiment of a pulse sequence according to the present invention.

As shown in FIGS. 3 and 4, the present invention reduces the repetition time TR and is designed to operate in the steady state. In order to do so, as shown in FIGS. 3 and 4, the gradient areas between RF pulses must be equal. Further, phase encoding and rewinder gradients are incorporated in pairs. It is also necessary to have a rewinder gradient on each B data acquisition. An additional gradient pulse must also be added to the slice select gradients to match the slice selection refocusing gradient.

As shown in FIG. 3, a first embodiment of the invention includes a pulse sequence 90 for use with MR image acquisition having at least first and second RF pulses 92, 94 separated by an interval τ, each RF pulse having an amplitude and a phase, wherein the phase is adjustable and the amplitude is fixed. A flip angle of the RF pulses is assumed to be the same for each RF pulse so as to apply standard steady state theory. However, it may be possible to practice the invention with varying flip angles without deviating from the spirit of the invention. The readout gradients 96, 98 are similar to those of FIG. 2, except that the second readout gradient 98 is modified to maintain the steady state requirement that the gradient areas between RF pulses be equal. The phase encoding gradients are modified to include a rewinder gradient 100 to pair up with each phase encoding gradient 102. The slice select excitation gradient 104 is modified to add a negative going pulse 106 to match the refocusing gradient 108. The pulse sequence 90 includes data acquisition periods 110, 112 in which data acquisition signals A, B are acquired. The periods 110, 112 have centers offset from the first RF pulse 92 of the pulse sequence 90 by an interval ε. As previously mentioned, the spacing of successive pulse sequences 90 must be such that the excitation pulses 104 are separated by two τ.

Although it appears from FIG. 3, that there are two different types of RF pulses, they are in fact, each acting as both an excitation pulse and a refocusing pulse, due to the steady state nature of this pulse sequence. Because of the gradients though, echoes from the excitation pulse and the free induction decay (FID) signals from the refocusing pulse are each suppressed.

FIG. 4 shows an alternate embodiment of the pulse sequence of FIG. 3, that in some respects, optimizes the pulse sequence of FIG. 3 so that both the A and B acquisitions occur between every pair of RF pulses. In essence, the pulse sequence 114 of FIG. 4 can acquire the same amount of data as that for FIG. 3, but with half the number of RF pulses. As shown, at least two data acquisition signals A and B are acquired during data acquisition periods 116 and 118 between a first RF pulse 120 and a second RF pulse 122, which together with the gradients located below the RF pulses, from the center of the first RF pulse 120 to the center of the second RF pulse 122, comprise one section of the pulse sequence 114. The pulse sequence 114 is similar to the pulse sequence 90 of FIG. 3. However, because the refocusing gradient is removed, it is necessary to introduce a dephasing gradient 124 between the pair of readout gradients 96 and 98 to dephase the A signal and rephase the B signal which prevents signal pass-over into another data acquisition period.

Accordingly, the present invention includes a method of acquiring T2 weighted MR images with reduced repetition time TR having the steps of acquiring a first MR image having at least T1 weighted contrast, acquiring a second MR image having both T1 and T2 weighted contrast, then calculating a ratio of the first and second MR images to acquire a T2 weighted contrast image. The sequence is then repeated for steady state operation. The first image acquired is a pure T1 weighted image and the second image has both the pure T1 weighting of the first image together with pure T2 weighting.

The steps of acquiring subsequent first and second MR images includes a step of spoiling undesirable RF signal coherences. The invention also includes the steps of transmitting at least first and second RF pulses, each equally spaced by a period τ, and wherein each acquisition step is offset from an RF pulse by an interval ε. The acquisition steps include an acquisition period having a center point and wherein the center point of each acquisition period is offset from a first RF pulse in a pulse sequence by an interval ε.

In order to spoil the unwanted signal coherences, the phase of the RF pulses is incremented linearly, according to:

$$\phi_n = \phi_{n-1} + n\delta \quad [2]$$
$$= \frac{n(n+1)\delta}{2}$$

where δ is optimized, preferably at approximately 117° or 121°. However, depending upon application, it is possible that other values may be preferred. By incrementing the phase in a linear fashion according to Eqn. 2, virtually all signal coherences are spoiled except for the FID and the primary spin echo to prevent the contrast from becoming unstable.

The method also includes adjusting a reception phase of the RF receiver in transceiver 58 of FIG. 1 based on a phase of a prior RF pulse for each MR image acquired. This step is needed in order to correctly interpret the data. For the A signal, after the nth RF pulse, the receiver phase is given by:

$$\theta_n = \phi_n + k \quad [3]$$

where k is any constant. For the B signal, after the (n+1) th RF pulse, the reception phase of the second MR image is given by:

$$\theta_{n+1} = \phi_n + 2(\phi_{n+1} - \phi_n) + q \quad [4]$$

where q is any constant. Although the reception phase still depends on the phase of the excitation RF pulse, as in Eqn. 3, it now also depends on twice the difference in phase between the excitation and refocusing pulses.

The signal levels for A and $B_1$ with the shorter repetition time TR, are reduced from those of Eqn. 1 by a factor of:

$$M_{ss} = \frac{1 - \exp(-\tau/T1)}{1 - \cos(\alpha)\exp(-\tau/T1)} \quad [5]$$

The amplitudes $S_A$ and $S_B$ are then given by:

$$S_A \propto \frac{1 - \exp(-\tau/T1)}{1 - \cos(\alpha)\exp(-\tau/T1)} \sin(\alpha)\exp(-\varepsilon/T2^*); \quad [6]$$

$$S_B \propto \frac{1 - \exp(-\tau/T1)}{1 - \cos(\alpha)\exp(-\tau/T1)} \sin(\alpha)\cos(\beta/2)\exp(-\varepsilon/T2^*)\exp(-2\tau/T2). \quad [7]$$

By dividing $S_B$ by $S_A$, a pure T2 weighted signal is obtained.

In order to reconstruct an image, the data processing steps include creating a magnitude image for each of the first and second images, then creating a mask image from at least one of the magnitude images. The mask image is used to identify regions of zero or low signal and can be created by using a simple thresholding scheme whereby in regions where the signal is greater than a predefined value, the mask is set to a value of 1, and in all other regions, the mask is set to a value of 0. Afterward, the ratio image can then be calculated by dividing each pixel value of the second MR image by a corresponding pixel value of the first image if a corresponding mask image pixel value has been set to 1, otherwise all ratio image pixel values are set to 0.

Accordingly, another aspect of the invention is a pulse sequence for use with MR image acquisition having at least first and second RF pulses separated by an interval $\tau$, the RF pulses having an amplitude and a phase, wherein the phase is incremented linearly in the pulse sequence. The pulse sequence has at least two data acquisition signals A, B that are acquirable during data acquisitions periods having centers offset from a first RF pulse of a pulse sequence by an interval $\epsilon$. The slice gradient areas located between RF pulses have equal areas, and phase encoding and rewinder gradients are paired.

The invention also includes an MRI apparatus to rapidly acquire T2 weighted MR images that includes a magnetic resonance imaging (MRI) system, such as that disclosed with reference to FIG. 1, having a plurality of gradient coils 50 positioned about a bore of a magnet 52 to impress a polarizing magnetic field. The MRI system also has an RF transceiver system 58 and an RF switch 62 controlled by a pulse module 38 to transmit and receive RF signals to and from an RF coil assembly 56 to acquire MR images. The MRI apparatus also includes a computer 20 programmed to transmit at least one RF pulse and adjust a phase of a subsequent RF pulse to spoil undesirable RF signal coherences. The computer is then programmed to acquire a first MR image having pure T1 weighted contrast, and calculate a ratio of the first and second MR images to acquire a pure T2 weighted contrast image, as shown and described with reference to both FIGS. 3 and 4.

The computer is further programmed to transmit at least two RF pulses, each equally spaced by a period $\tau$, and wherein each acquisition step is offset from an RF pulse by an interval $\epsilon$. The computer increments the phase $\phi$ of the RF pulses linearly according to Eqn. 2. The computer is also programmed to adjust a reception phase $\theta$ of the RF transceiver system 58 based on a phase $\phi_n$ n of a prior RF pulse for each MR image acquired, wherein the adjustment is given by Eqn. 3. The reception phase of the second MR image is also programmed by the computer, according to Eqn. 4.

In order to reconstruct an MR image according to the present invention, the computer is also programmed to create a magnitude image for each of the first and second MR images. A binary mask image is created from either of the magnitude images, or a combination of both. The mask image is used to identify regions of zero or low signal. In a preferred embodiment, the mask image is created using a simple thresholding scheme, whereby in regions where the signal is greater than a predefined value, the mask is set to a value of 1, and in all other regions, the mask is set to a value of 0. The ratio image is then calculated by dividing each pixel value of the second MR image by a corresponding pixel value of the first image if a corresponding mask image pixel value has been set to 1, otherwise all ratio image pixel values are set to 0.

The present invention has been described in terms of the preferred embodiment, and it is recognized that equivalents, alternatives, and modifications, aside from those expressly stated, are possible and within the scope of the appending claims.

What is claimed is:

1. A method of acquiring T2 weighted MR images with reduced repetition time comprising the steps of:
   acquiring a first MR image having at least T1 weighted contrast;
   acquiring a second MR image having both T1 and T2 weighted contrast;
   calculating a ratio image of the first and second MR images to acquire a T2 weighted contrast image; and
   repeating the acquisition steps in steady state.

2. The method of claim 1 where the first MR image is a pure T1 weighted image and the second MR image comprises both pure T1 weighted contrast and pure T2 weighted contrast.

3. The method of claim 1 further comprising a step of transmitting at least one RF pulse prior to MR image acquisition and step of spoiling undesirable RF signal coherences prior to each subsequent acquisition of first and second MR images.

4. The method of claim 3 further comprising the step of transmitting at least two RF pulses, each equally spaced by a period $\tau$, and wherein each acquisition step is offset from an RF pulse by an interval $\epsilon$.

5. The method of claim 4 wherein each acquisition step includes an acquisition period having a center and wherein the center of each acquisition period is offset from a first RF pulse in a pulse sequence by an interval $\epsilon$.

6. The method of claim 3 wherein the step of spoiling undesirable RF signal coherences includes varying the phase of subsequent RF pulses.

7. The method of claim 3 wherein the step of spoiling undesirable RF signal coherences includes incrementing a phase of subsequent RF pulses linearly.

8. The method of claim 7 wherein the undesirable signal coherences include all signal coherences except free induction decay signals and primary spin echo signals.

9. The method of claim 7 wherein the phase is incremented according to:

$$\phi_n = \phi_{n-1} + n\delta$$

where $\phi$ is a phase of an RF pulse, n is a number representation of an RF pulse, and $\delta$ is an optimal phase angle.

10. The method of claim 9 wherein $\delta$ is one of approximately 117° and approximately 121°.

11. The method of claim 9 further comprising adjusting a reception phase of an RF receiver based on a phase of a prior RF pulse for each MR image acquired.

12. The method of claim 11 wherein a reception phase $\theta$ of a first MR image after an RF pulse n is given by:

$$\theta_n = \phi_n + k$$

where k is any constant, and wherein a reception phase $\theta$ of a second MR image after an RF pulse (n+1) is given by:

$$\theta_{n+1} = \phi_n + 2(\phi_{n+1} - \phi_n) + q$$

where q is any constant.

13. The method of claim 1 further comprising the steps of:
creating magnitude images for each of the first and second MR images;
creating a mask image from at least one of the magnitude images wherein any pixel value below a predetermined threshold is set to 0 and all others are set to 1; and
wherein the calculating a ratio image step is further defined as dividing each pixel value of the second MR image by a corresponding pixel value of the first image if a corresponding mask image pixel value has been set to 1 and setting all ratio image pixel values to 0.

14. A pulse sequence for use with MR image acquisition comprised of:
at least first and second RF pulses separated by an interval $\tau$, each RF pulse having an amplitude S and a phase $\phi$, and wherein the phase is incremented linearly in the pulse sequence;
at least two data acquisition signals A, B, the data acquisition signals A, B having periods with centers offset from an RF pulse in the pulse sequence by an interval $\epsilon$; and
slice gradient areas located between RF pulses having equal areas.

15. The pulse sequence of claim 14 further comprising paired phase encoding and rewinder gradients.

16. The pulse sequence of claim 14 having a rewinder gradient applied to the B data acquisition signal.

17. The pulse sequence of claim 14 wherein the A data acquisition signal has pure T1 weighting and the B data acquisition signal contains the pure T1 weighting of the A data acquisition signal together with pure T2 weighting.

18. The pulse sequence of claim 14 wherein the phase of the RF pulses is incremented according to:

$$\phi_n = \frac{n(n+1)\delta}{2}$$

where $\delta$ is greater than 90°.

19. The pulse sequence of claim 14 wherein the first and second RF pulses have equal flip angles.

20. The pulse sequence of claim 14 wherein each successive pulse sequence has excitation pulses spaced by a period of $\tau$.

21. An MRI apparatus to rapidly acquire T2 weighted MR images comprising:
a magnetic resonance imaging (MRI) system having a plurality of gradient coils positioned about a bore of a magnet to impress a polarizing magnetic field, an RF transceiver system, and an RF switch controlled by a pulse module to transmit and receive RF signals to and from an RF coil assembly to acquire MR images; and
a computer programmed to:
transmit an RF pulse;
adjust a phase of a subsequent RF pulse to spoil undesirable RF signal coherences;
acquire a first MR image having pure T1 weighted contrast;
acquire a second MR image having both pure T1 weighted contrast and pure T2 weighted contrast; and
calculate a ratio of the first and second MR images to acquire a pure T2 weighted contrast image.

22. The MR apparatus of claim 21 wherein the computer is further programmed to transmit the first and second RF pulses, each equally spaced by a period $\tau$, and wherein each acquisition step is offset from an RF pulse by an interval $\epsilon$.

23. The MR apparatus of claim 22 wherein the computer is further programmed to increment the phase $\phi$ of the RF pulses n linearly according to:

$$\phi_n = \phi_{n-1} = n\iota$$

where $\delta$ is an optimal phase angle.

24. The MR apparatus of claim 23 wherein the computer is further programmed to adjust a reception phase $\theta_n$ of the RF transceiver system for the first MR image based on a phase $\theta_n$ of a prior RF pulse for each MR image acquired, wherein the adjustment is given by:

$$\theta_n = \phi_n + k$$

where k is any constant; and
wherein the reception phase $\theta_{n+1}$ of the second MR image is given by:

$$\theta_{n+1} = \phi_n + 2(\phi_{n+1} - \phi_n) + q$$

where q is any constant.

25. The MR apparatus of claim 21 wherein the computer is further programmed to:
create magnitude images for each of the first and second MR images; and
create a mask image from at least one of the magnitude images wherein any pixel value below a predetermined threshold is set to 0 and all others are set to 1; and
wherein the calculation of a ratio image is further defined as dividing each pixel value of the second MR image by a corresponding pixel value of the first MR image if a corresponding mask image pixel value has been set to 1, otherwise setting all ratio image pixel values to 0.

26. The MR apparatus of claim 21 wherein the computer is further programed to generate a pulse sequence comprised of:
- at least first and second RF pulses separated by an interval τ, each RF pulse having an amplitude S and a phase φ, and wherein the phase of the second and subsequent RF pulses in the pulse sequence is incremented linearly;
- at least two data acquisition signals A, B, the data acquisition signals A, B having periods with centers offset from a first RF pulse in a pulse sequence by an interval ε;
- slice gradient areas located between RF pulses having equal areas; and
- paired phase encoding and rewinder gradients.

27. The MR apparatus of claim 21 wherein the computer is further programmed to generate a pulse sequence having a rewinder gradient applied to the second MR image.

28. The MR apparatus of claim 21 wherein the computer is further programmed to generate a pulse sequence comprised of an A data acquisition period to acquire a pure T1 weighted signal and a B data acquisition period to acquire the T1 weighted signal of the A data acquisition period together with a pure T2 weighted signal.

29. The MR apparatus of claim 21 wherein the computer is further programmed to generate a pulse sequence in which the phase of the RF pulses is incremented according to:

$$\phi_n = \frac{n(n+1)\delta}{2}$$

where δ is greater than 90°.

30. The MR apparatus of claim 21 wherein the computer is further programmed to generate a pulse sequence having at least two RF pulses with equal flip angles.

31. The MR apparatus of claim 21 wherein the computer is further programmed to generate a pulse sequence wherein each successive pulse sequence has excitation pulses spaced by a period of 2τ.

* * * * *

UNITED STATES PATENT AND TRADEMARK OFFICE
CERTIFICATE OF CORRECTION

PATENT NO. : 6,239,597 B1
DATED : May 29, 2001
INVENTOR(S) : McKinnon, Graeme C.

It is certified that error appears in the above-identified patent and that said Letters Patent is hereby corrected as shown below:

Column 5,
Line 20, change "$S_A \sin(\alpha) \exp(-\varepsilon / T2^*)$;
   $S_b \sin(\alpha) \cos(\beta / 2) \exp(-\varepsilon / T2^*) \exp(-2\tau / T2)$"
   to
   -- $S_A \propto \sin(\alpha) \exp(-\varepsilon / T2^*)$;
   $S_b \propto \sin(\alpha) \cos(\beta / 2) \exp(-\varepsilon / T2^*) \exp(-2\tau / T2)$ --

Column 7,
Line 12, change "$\theta_{n+1} = \phi_n + 2(\phi_{n+1} - \phi_n) + q$"
   to
   -- $\vartheta_{n+1} = \phi_n + 2(\phi_{n+1} - \phi_n) + q$ --
Line 18, change "$B_1$" to -- B, --

Column 8,
Lines 11 and 14, change "$\phi$" to -- $\varphi$ --

Column 9,
Line 10, change "$\phi_n = \phi_{n-1} + n\delta$" to -- $\varphi_n = \varphi_{n-1} + n\delta$ --
Line 24, change "$\theta_n = \phi_n + k$" to -- $\theta_n = \varphi_n + k$ --
Line 30, change "$\theta_{n+1} = \phi_n + 2(\phi_{n+1} - \phi_n) + q$"
   to
   -- $\vartheta_{n+1} = \varphi_n + 2(\varphi_{n+1} - \varphi_n) + q$ --
Line 52, change "$B_1$" to -- B, --

Column 10,
Line 10, change "$\tau$" to -- $2\tau$ --
Line 38, change "$\phi_n = \phi_{n-1} =^{n\tau}$" to -- $\varphi_n = \varphi_{n+1} + n\delta$ --
Line 53, change "$\theta_{n+1} = \phi_n + 2(\phi_{n+1} - \phi_n) + q$"
   to
   -- $\vartheta_{n+1} = \phi_n + 2(\phi_{n+1} - \phi_n) + q$ --

UNITED STATES PATENT AND TRADEMARK OFFICE
CERTIFICATE OF CORRECTION

PATENT NO. : 6,239,597 B1
DATED : May 29, 2001
INVENTOR(S) : McKinnon, Graeme C.

It is certified that error appears in the above-identified patent and that said Letters Patent is hereby corrected as shown below:

Column 11,
Line 8, change "$B_1$" to -- B, --

Signed and Sealed this

Fifth Day of February, 2002

Attest:

Attesting Officer

JAMES E. ROGAN
Director of the United States Patent and Trademark Office